(12) United States Patent
Hsu

(10) Patent No.: US 8,057,708 B2
(45) Date of Patent: *Nov. 15, 2011

(54) STABILIZED COMPOSITIONS OF CONDUCTIVE POLYMERS AND PARTIALLY FLUORINATED ACID POLYMERS

(75) Inventor: Che-Hsiung Hsu, Wilmington, DE (US)

(73) Assignee: E. I. du Pont de Nemours and Company, Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 11/770,822

(22) Filed: Jun. 29, 2007

(65) Prior Publication Data

US 2008/0023676 A1    Jan. 31, 2008

Related U.S. Application Data

(60) Provisional application No. 60/817,954, filed on Jun. 30, 2006.

(51) Int. Cl.
*H01B 1/00* (2006.01)
(52) U.S. Cl. .......... 252/500; 528/210; 528/373
(58) Field of Classification Search .......... 252/500, 252/519.21, 519.33, 520.1; 257/40; 429/33; 521/27; 524/262, 795, 800; 525/182; 430/529; 528/210, 373
See application file for complete search history.

(56) References Cited

U.S. PATENT DOCUMENTS

| | | | |
|---|---|---|---|
| 3,282,875 A * | 11/1966 | Connolly et al. | 524/795 |
| 3,784,399 A | 1/1974 | Grot | |
| 4,358,545 A * | 11/1982 | Ezzell et al. | 521/27 |
| 4,433,082 A | 2/1984 | Grot | |
| 4,568,483 A | 2/1986 | Naarmann et al. | |
| 4,940,525 A | 7/1990 | Ezzell | |
| 5,281,680 A | 1/1994 | Grot | |
| 5,300,575 A | 4/1994 | Jonas | |
| 5,463,005 A | 10/1995 | Desmarteau | |
| 6,150,426 A | 11/2000 | Curtin et al. | |
| 6,303,238 B1 | 10/2001 | Thompson et al. | |
| 6,670,645 B2 | 12/2003 | Grusin et al. | |
| 6,685,853 B1 | 2/2004 | Angelopoulos et al. | |
| 6,710,123 B1 * | 3/2004 | Amin-Sanayei et al. | 524/805 |
| 6,759,441 B1 | 7/2004 | Kerres et al. | |
| 6,955,772 B2 | 10/2005 | Van den Bogaert | |
| 7,317,047 B2 | 1/2008 | Hsu | |
| 7,338,620 B2 | 3/2008 | Hsu et al. | |
| 7,431,866 B2 * | 10/2008 | Hsu et al. | 252/500 |
| 7,455,793 B2 | 11/2008 | Hsu et al. | |
| 7,638,072 B2 * | 12/2009 | Hsu et al. | 252/500 |

(Continued)

FOREIGN PATENT DOCUMENTS

EP    0269090 B1    2/1994

(Continued)

OTHER PUBLICATIONS

U.S. Appl. No. 60/105,662, filed Oct. 25. 1999, Zhen-Yu Yang et al.

(Continued)

*Primary Examiner* — Khanh Tuan Nguyen

(57) ABSTRACT

There is provided an electrically conductive polymer composition. The composition includes an electrically conductive polymer and a partially-fluorinated acid polymer. At least 50% of acid protons on the partially-fluorinated acid polymer are replaced with cations. The cations can be inorganic cations, organic cations, and combinations thereof.

11 Claims, 1 Drawing Sheet

U.S. PATENT DOCUMENTS

| | | | | |
|---|---|---|---|---|
| 7,722,785 | B2 * | 5/2010 | Hsu et al. | 252/500 |
| 7,727,421 | B2 * | 6/2010 | Hsu et al. | 252/500 |
| 2001/0016303 | A1 | 8/2001 | Majumdar et al. | |
| 2002/0146442 | A1 | 10/2002 | Sendelbach et al. | |
| 2003/0008190 | A1 * | 1/2003 | Chisholm et al. | 429/33 |
| 2003/0222250 | A1 | 12/2003 | Hsu | |
| 2004/0044214 | A1 | 3/2004 | Andriessen | |
| 2004/0064152 | A1 | 4/2004 | Zvuloni | |
| 2004/0102577 | A1 * | 5/2004 | Hsu et al. | 525/182 |
| 2004/0126666 | A1 | 7/2004 | Cao et al. | |
| 2004/0127637 | A1 * | 7/2004 | Hsu et al. | 524/800 |
| 2004/0149962 | A1 | 8/2004 | Andriessen | |
| 2004/0206942 | A1 * | 10/2004 | Hsu | 252/500 |
| 2004/0254297 | A1 | 12/2004 | Hsu et al. | |
| 2004/0266924 | A1 * | 12/2004 | Yang | 524/262 |
| 2005/0033015 | A1 | 2/2005 | Pei | |
| 2005/0049319 | A1 | 3/2005 | Stone et al. | |
| 2005/0052027 | A1 | 3/2005 | Priem | |
| 2005/0064152 | A1 | 3/2005 | Aylward et al. | |
| 2005/0184287 | A1 | 8/2005 | Herron et al. | |
| 2005/0205860 | A1 | 9/2005 | Hsu et al. | |
| 2005/0222333 | A1 | 10/2005 | Hsu | |
| 2006/0076557 | A1 * | 4/2006 | Waller et al. | 257/40 |
| 2007/0069184 | A1 | 3/2007 | Hsu et al. | |
| 2007/0069185 | A1 | 3/2007 | Hsu et al. | |
| 2007/0129534 | A1 | 6/2007 | Ohata et al. | |
| 2008/0213594 | A1 | 9/2008 | Hsu | |

FOREIGN PATENT DOCUMENTS

| | | |
|---|---|---|
| EP | 0593111 B1 | 6/1998 |
| EP | 1026152 A1 | 8/2000 |
| EP | 1 647 566 A | 4/2006 |
| EP | 1647566 A2 * | 4/2006 |
| JP | 2003158043 A | 5/2003 |
| WO | WO 98/31716 A1 | 7/1998 |
| WO | WO 99/52954 A1 | 10/1999 |
| WO | WO 00/70655 A2 | 11/2000 |
| WO | WO 01/41512 A1 | 6/2001 |
| WO | 03006537 A1 | 1/2003 |
| WO | WO 03/008424 A1 | 1/2003 |
| WO | WO 03/040257 A1 | 5/2003 |
| WO | WO 03/063555 A1 | 7/2003 |
| WO | WO 03/091688 A2 | 11/2003 |
| WO | WO 2004/016710 A1 | 2/2004 |
| WO | 2005052027 A1 | 6/2005 |
| WO | 2005090435 A1 | 9/2005 |
| WO | WO 2005/090434 A | 9/2005 |
| WO | WO 2005/090436 A | 9/2005 |
| WO | 2005121217 A1 | 12/2005 |

OTHER PUBLICATIONS

U.S. Appl. No. 60/176,881, filed Jan. 9, 2000, Jose Manuel Rodriquez-Parada.

CRC Handbook of Chemistry and Physics, 81 St Edition, 2000-2001.

Lee et al., Poly(thieno[3,4-b]thiophene). A New Stable Low Band Gap Conducting Polymer, Macromoleciles, 2001, vol. 34:5746-5747.

Sotzing et al., Poly(thieno[3,4-b]thiophene): A p- and n-Dopable Polythiophene Exhibiting High Optical Transparency in the Semiconducting State, Macromolecules, 2002, vol. 35;7281-7286.

A. Feiring et al., Aromatic Monomers With Pendant Fluoroalkylsulfonate and Sulfonimide Groups, J. Fluorine Chemistry, 2000, vol. 105:129-135.

A. Feiring et al., Novel Aromatic Polymers With Pendant Lithium Perfluoroalkylsulfonate or Sulfonimide Groups, Macromolecules, 2000, vol. 33:9262-9271.

D.D. Desmarteau, Novel Perfluorinated Ionomers and Ionenes, J. Fluorine Chem 1995, vol. 72:203-208.

A.J. Appleby et al., Polymeric Perfluoro Bis-Sulfonimides As Possible Fuel Cell Electrolytes, J. Electrochem. Soc., vol. 140:109-111.

Gustafsson et al., Flexible Light-Emitting Diodes Made From Soluble Conducting Polymers, Nature, 1992, vol. 357:477-479.

Wang, Photoconductive Polymers, Kirk-Othmer Encyclopedia of Chemical Technology, Fourth Edition, 1996, vol. 18:837-860.

Written Opinion of the International Searching Authority, PCT/US2007/015323, Jan. 6, 2009, PCT counterpart of the present application.

European Patent Office Communication in EP Application No. 07 810 131, EP counterpart of the present application, Sep. 24, 2009.

Agibaloya et al., Supramolecular Organization of Polyfluorinated Copolymers in Solutions, 1999, Polymer Science, vol. 40, p. 615-621.

Pickup, Peter et al., Electronically Conducting Cation-Exchange Polymer Powders; Synthesis, Characterization and Applications in Pem Fuel Cells and Supercapacitors. Journal of New Materials for Electrochemical Systems, 1999, pp. 21-26, 3.

PCT International Search Report for International Application No. PCT/US2007/015323, D. Marsitzky Authorized Officer, Dec. 18, 2007.

PCT International Search Report and Written Opinion for International Application No. PCT/US2007/026438, D. Marsitzky Authorized Officer, Apr. 22, 2008.

PCT International Search Report and Written Opinion for International Application No. PCT/US06/25012, L. Young Authorized Officer, Oct. 26, 2007.

Supplementary European Search Report from EP 06774121.5 Feb. 12, 2010.

PCT International Search Report and Written Opinion for International Application No. PCT/US06/25014, L. Young Authorized Officer, Jul. 25, 2007.

* cited by examiner

US 8,057,708 B2

STABILIZED COMPOSITIONS OF CONDUCTIVE POLYMERS AND PARTIALLY FLUORINATED ACID POLYMERS

CROSS REFERENCE TO RELATED APPLICATION

This application claims priority from U.S. provisional application Ser. No. 60/817,954, dated Jun. 30, 2006, which is incorporated by reference herein.

BACKGROUND INFORMATION

1. Field of the Disclosure

This disclosure relates in general to electrically conductive polymer compositions, and their uses in organic electronic devices.

2. Description of the Related Art

Organic electronic devices define a category of products that include an active layer. Such devices convert electrical energy into radiation, detect signals through electronic processes, convert radiation into electrical energy, or include one or more organic semiconductor layers.

Organic light-emitting diodes (OLEDs) are organic electronic devices comprising an organic layer capable of electroluminescence. OLEDs can have the following configuration:

anode/buffer layer/EL material/cathode and may include additional option layers, materials or compositions. The anode is typically any material that is transparent and has the ability to inject holes into the EL material, such as, for example, indium/tin oxide (ITO). The anode is optionally supported on a glass or plastic substrate. EL materials include fluorescent compounds, fluorescent and phosphorescent metal complexes, conjugated polymers, and combinations and mixtures thereof. The cathode is typically any material (such as, e.g., Ca or Ba) that has the ability to inject electrons into the EL material. The buffer layer is typically an electrically conducting polymer and facilitates the injection of holes from the anode into the EL material layer. The buffer layer may also have other properties which facilitate device performance.

There is a continuing need for buffer materials with improved properties.

SUMMARY

There is provided an electrically conductive polymer composition comprising an electrically conductive polymer and a partially-fluorinated acid polymer, wherein at least 50% of the acid protons are replaced with a cation selected from inorganic cations, organic cations, and combinations thereof.

In one embodiment, the polymeric acid is a water-soluble partially-fluorinated sulfonic acid polymer.

In another embodiment, there is provided an aqueous dispersion of an electrically conductive polymer and a partially-fluorinated acid polymer.

In another embodiment, electronic devices comprising at least one layer comprising the new conductive polymer composition are provided.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
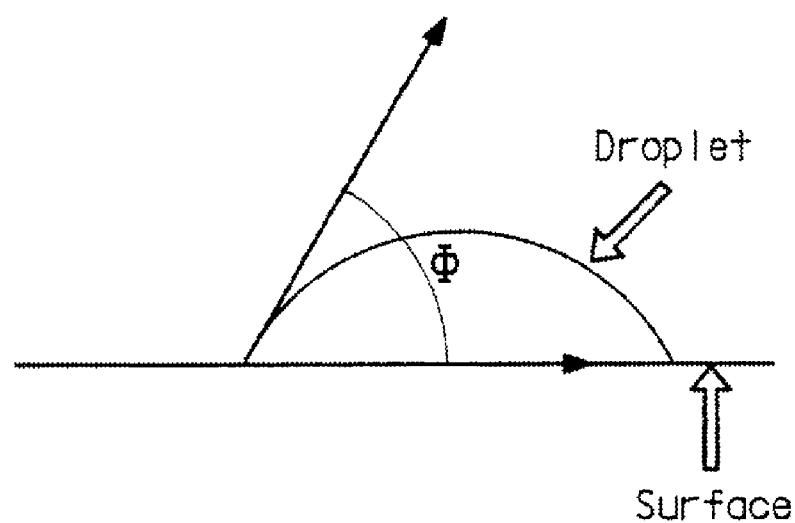
FIG. 1 includes a diagram illustrating a contact angle.

Skilled artisans will appreciate that objects in the figures are illustrated for simplicity and clarity and have not necessarily been drawn to scale. For example, the dimensions of some of the objects in the figures may be magnified relative to other objects to help to improve understanding of embodiments.

DETAILED DESCRIPTION

Many aspects and embodiments are described herein and are exemplary and non-limiting. After reading this specification, skilled artisans will appreciate that other aspects and embodiments are possible without departing from the scope of the disclosure and appended claims.

Other features and benefits of any one or more of the embodiments will be apparent from the following detailed description and from the claims. The detailed description first addresses Definitions and Clarification of Terms followed by the Conductive Polymer, the Partially-Fluorinated Acid Polymer, Cations, Methods of Making the Conductive Compositions, Electronic Devices, and finally, Examples.

Definitions and Clarification of Terms Used in the Specification and Claims

Before addressing details of embodiments described below, some terms are defined or clarified.

As used herein the term "conductor" and its variants are intended to refer to a layer material, member, or structure having an electrical property such that current flows through such layer material, member, or structure without a substantial drop in potential. The term is intended to include semiconductors. In one embodiment, a conductor will form a layer having a conductivity of at least $10^{-7}$ S/cm.

The term "electrically conductive material" refers to a material which is inherently or intrinsically capable of electrical conductivity without the addition of carbon black or conductive metal particles.

The term "hole injection" when referring to a layer, material, member, or structure, is intended to mean such layer, material, member, or structure facilitates injection and migration of positive charges through the thickness of such layer, material, member, or structure with relative efficiency and small loss of charge.

"Hole transport" when referring to a layer, material, member, or structure, is intended to mean such layer, material, member, or structure facilitates migration of positive charges through the thickness of such layer, material, member, or structure with relative efficiency and small loss of charge. As used herein, the term "hole transport layer" does not encompass a light-emitting layer, even though that layer may have some hole transport properties.

The term "polymer" is intended to mean a material having at least one repeating monomeric unit. The term includes homopolymers having only one kind, or species, of monomeric unit, and copolymers having two or more different monomeric units, including copolymers formed from monomeric units of different species.

The term "partially-fluorinated acid polymer" refers to a polymer having acidic groups, where at least some, but not all of the hydrogens have been replaced by fluorine. In one embodiment, the partially-fluorinated acid polymer has 20-80% of the hydrogens replaced by fluorine; in one embodiment, 40-60% are replaced.

The term "acidic group" refers to a group capable of ionizing to donate a hydrogen ion to a base.

The composition may comprise one or more different electrically conductive polymers and one or more different partially-fluorinated acid polymers.

The term "doped" is intended to mean that the electrically conductive polymer has a polymeric counterion to balance the charge on the conductive polymer.

The term "in admixture with" is intended to mean that an electrically conductive polymer is physically mixed with a fluorinated acid polymer.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited In case of conflict, the present specification, including definitions, will control. In addition, the materials, methods, and examples are illustrative and not intended to be limiting.

To the extent not described herein, many details regarding specific materials, processing acts, and circuits are conventional and may be found in textbooks and other sources within the organic light-emitting diode display, lighting source, photodetector, photovoltaic, and semiconductive member arts.

1. Conductive Polymer

In one embodiment, the conductive polymer will form a film which has a conductivity of at least $10^{-7}$ S/cm. The monomer from which the conductive polymer is formed, is referred to as a "precursor monomer". A copolymer will have more than one precursor monomer.

In one embodiment, the conductive polymer is made from at least one precursor monomer selected from thiophenes, selenophenes, tellurophenes, pyrroles, anilines, and polycyclic aromatics. The polymers made from these monomers are referred to herein as polythiophenes, poly(selenophenes), poly(tellurophenes), polypyrroles, polyanilines, and polycyclic aromatic polymers, respectively. The term "polycyclic aromatic" refers to compounds having more than one aromatic ring. The rings may be joined by one or more bonds, or they may be fused together. The term "aromatic ring" is intended to include heteroaromatic rings. A "polycyclic heteroaromatic" compound has at least one heteroaromatic ring. In one embodiment, the polycyclic aromatic polymers are poly(thienothiophenes).

In one embodiment, monomers contemplated for use to form the electrically conductive polymer in the new composition comprise Formula I below:

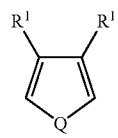

(I)

wherein:
Q is selected from the group consisting of S, Se, and Te;
$R^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, selenium, tellurium, sulfur or oxygen atoms.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group have been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group have been replaced by another atom, such as nitrogen, oxygen, sulfur, and the like. The term "alkenylene" refers to an alkenyl group having two points of attachment.

As used herein, the following terms for substituent groups refer to the formulae given below:

"alcohol" —$R^3$—OH

"amido" —$R^3$—C(O)N($R^6$)$R^6$

"amidosulfonate" —$R^3$—C(O)N($R^6$)$R^4$—$SO_3Z$

"benzyl" —$CH_2$—$C_6H_5$

"carboxylate" —$R^3$—C(O)O—Z or —$R^3$—O—C(O)—Z

"ether" —$R^3$—(O—$R^5$)$_p$—O—$R^5$

"ether carboxylate" —$R^3$—O—$R^4$—C(O)O—Z or —$R^3$—O—$R^4$—O—C(O)—Z

"ether sulfonate" —$R^3$—O—$R^4$—$SO_3Z$

"ester sulfonate" —$R^3$—O—C(O)—$R^4$—$SO_3Z$

"sulfonimide" —$R^3$—$SO_2$—NH—$SO_2$—$R^5$

"urethane" —$R^3$—O—C(O)—$N(R^6)_2$ where all "R" groups are the same or different at each occurrence and:
$R^3$ is a single bond or an alkylene group
$R^4$ is an alkylene group
$R^5$ is an alkyl group
$R^6$ is hydrogen or an alkyl group
p is 0 or an integer from 1 to 20
Z is H, alkali metal, alkaline earth metal, $N(R^5)_4$ or $R^5$
Any of the above groups may, further, be unsubstituted or substituted, and any group may have F substituted for one or more hydrogens, and may comprise perfluorinated groups. In one embodiment, the alkyl and alkylene groups have from 1-20 carbon atoms.

In one embodiment, in the monomer, both $R^1$ together form —O—$(CHY)_m$—O—, where m is 2 or 3, and Y is the same or different at each occurrence and is selected from hydrogen, halogen, alkyl, alcohol, amidosulfonate, benzyl, carboxylate, ether, ether carboxylate, ether sulfonate, ester sulfonate, and urethane, where the Y groups may be partially or fully fluorinated. In one embodiment, all Y are hydrogen. In one embodiment, the polymer is poly(3,4-ethylenedioxythiophene). In one embodiment, at least one Y group is not hydrogen. In one embodiment, at least one Y group is a substituent having F substituted for at least one hydrogen. In one embodiment, at least one Y group is perfluorinated.

In one embodiment, the monomer has Formula I(a):

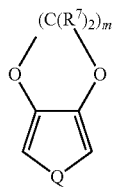

(Ia)

wherein:
Q is selected from the group consisting of S, Se, and Te;
$R^7$ is the same or different at each occurrence and is selected from hydrogen, alkyl, heteroalkyl, alkenyl, heteroalkenyl, alcohol, amidosulfonate, benzyl, carboxylate, ether, ether carboxylate, ether sulfonate, ester sulfonate, and urethane, with the proviso that at least one $R^7$ is not hydrogen, and
m is 2 or 3.

In one embodiment of Formula I(a), m is two, one $R^7$ is an alkyl group of more than 5 carbon atoms, and all other $R^7$ are hydrogen. In one embodiment of Formula I(a), at least one $R^7$ group is fluorinated. In one embodiment, at least one $R^7$ group has at least one fluorine substituent. In one embodiment, the $R^7$ group is fully fluorinated.

In one embodiment of Formula I(a), the $R^7$ substituents on the fused alicyclic ring on the monomer offer improved solubility of the monomers in water and facilitate polymerization in the presence of the fluorinated acid polymer.

In one embodiment of Formula I(a), m is 2, one $R^7$ is sulfonic acid-propylene-ether-methylene and all other $R^7$ are hydrogen. In one embodiment, m is 2, one $R^7$ is propyl-ether-ethylene and all other $R^7$ are hydrogen. In one embodiment, m is 2, one $R^7$ is methoxy and all other $R^7$ are hydrogen. In one embodiment, one $R^7$ is sulfonic acid difluoromethylene ester methylene (—$CH_2$—O—C(O)—$CF_2$—$SO_3H$), and all other $R^7$ are hydrogen.

In one embodiment, pyrrole monomers contemplated for use to form the electrically conductive polymer in the new composition comprise Formula II below.

(II)

where in Formula II:
$R^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, amidosulfonate, ether carboxylate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur, selenium, tellurium, or oxygen atoms; and
$R^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, ether sulfonate, ester sulfonate, and urethane.

In one embodiment, $R^1$ is the same or different at each occurrence and is independently selected from hydrogen, alkyl, alkenyl, alkoxy, cycloalkyl, cycloalkenyl, alcohol, benzyl, carboxylate, ether, amidosulfonate, ether carboxylate, ether sulfonate, ester sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

In one embodiment, $R^2$ is selected from hydrogen, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

In one embodiment, the pyrrole monomer is unsubstituted and both $R^1$ and $R^2$ are hydrogen.

In one embodiment, both $R^1$ together form a 6- or 7-membered alicyclic ring, which is further substituted with a group selected from alkyl, heteroalkyl, alcohol, benzyl, carboxylate, ether, ether carboxylate, ether sulfonate, ester sulfonate, and urethane. These groups can improve the solubility of the monomer and the resulting polymer. In one embodiment, both $R^1$ together form a 6- or 7-membered alicyclic ring, which is further substituted with an alkyl group. In one embodiment, both $R^1$ together form a 6- or 7-membered alicyclic ring, which is further substituted with an alkyl group having at least 1 carbon atom.

In one embodiment, both $R^1$ together form —O—$(CHY)_m$—O—, where m is 2 or 3, and Y is the same or different at each occurrence and is selected from hydrogen, alkyl, alcohol, benzyl, carboxylate, amidosulfonate, ether, ether carboxylate, ether sulfonate, ester sulfonate, and urethane. In one embodiment, at least one Y group is not hydrogen. In one embodiment, at least one Y group is a substituent having F substituted for at least one hydrogen. In one embodiment, at least one Y group is perfluorinated.

In one embodiment, aniline monomers contemplated for use to form the electrically conductive polymer in the new composition comprise Formula III below.

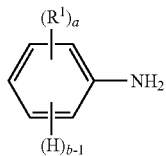

(III)

wherein:
a is 0 or an integer from 1 to 4;
b is an integer from 1 to 5, with the proviso that a+b=5; and
$R^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms.

When polymerized, the aniline monomeric unit can have Formula IV(a) or Formula IV(b) shown below, or a combination of both formulae.

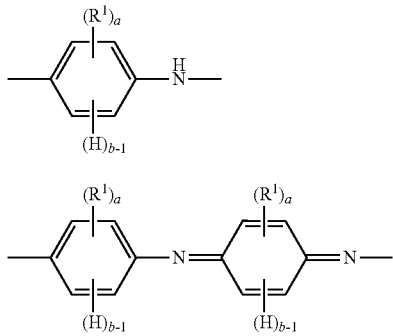

IV(a)

IV(b)

where a, b and $R^1$ are as defined above.

In one embodiment, the aniline monomer is unsubstituted and a=0.

In one embodiment, a is not 0 and at least one $R^1$ is fluorinated. In one embodiment, at least one $R^1$ is perfluorinated.

In one embodiment, fused polycyclic heteroaromatic monomers contemplated for use to form the electrically conductive polymer in the new composition have two or more fused aromatic rings, at least one of which is heteroaromatic. In one embodiment, the fused polycyclic heteroaromatic monomer has Formula V:

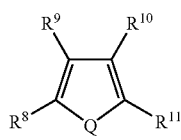

(V)

wherein:
Q is S, Se, Te, or $NR^6$;
$R^6$ is hydrogen or alkyl;
$R^8$, $R^9$, $R^{10}$, and $R^{11}$ are independently selected so as to be the same or different at each occurrence and are selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; and
at least one of $R^8$ and $R^9$, $R^9$ and $R^{10}$, and $R^{10}$ and $R^{11}$ together form an alkenylene chain completing a 5 or 6-membered aromatic ring, which ring may optionally include one or more divalent nitrogen, sulfur, selenium, tellurium, or oxygen atoms.

In one embodiment, the fused polycyclic heteroaromatic monomer has Formula V(a), V(b), V(c), V(d), V(e), V(f), and V(g):

(Va)

(Vb)

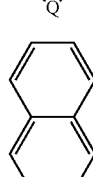

(Vc)

-continued

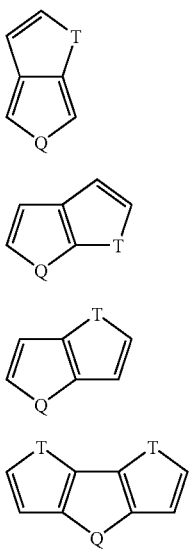

(Vd)

(Ve)

(Vf)

(Vg)

wherein:
Q is S, Se, Te, or NH; and
T is the same or different at each occurrence and is selected from S, $NR^6$, O, $SiR^6{}_2$, Se, Te, and $PR^6$;
$R^6$ is hydrogen or alkyl.

The fused polycyclic heteroaromatic monomers may be substituted with groups selected from alkyl, heteroalkyl, alcohol, benzyl, carboxylate, ether, ether carboxylate, ether sulfonate, ester sulfonate, and urethane. In one embodiment, the substituent groups are fluorinated. In one embodiment, the substituent groups are fully fluorinated.

In one embodiment, the fused polycyclic heteroaromatic monomer is a thieno(thiophene). Such compounds have been discussed in, for example, Macromolecules, 34, 5746-5747 (2001); and Macromolecules, 35, 7281-7286 (2002). In one embodiment, the thieno(thiophene) is selected from thieno(2,3-b)thiophene, thieno(3,2-b)thiophene, and thieno(3,4-b)thiophene. In one embodiment, the thieno(thiophene) monomer is substituted with at least one group selected from alkyl, heteroalkyl, alcohol, benzyl, carboxylate, ether, ether carboxylate, ether sulfonate, ester sulfonate, and urethane. In one embodiment, the substituent groups are fluorinated. In one embodiment, the substituent groups are fully fluorinated.

In one embodiment, polycyclic heteroaromatic monomers contemplated for use to form the polymer in the new composition comprise Formula VI:

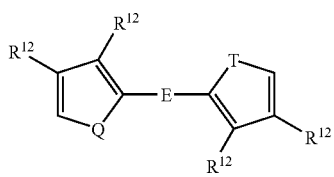

(VI)

wherein:
Q is S, Se, Te, or $NR^6$;
T is selected from S, $NR^6$, O, $SiR^6{}_2$, Se, Te, and $PR^6$;
E is selected from alkenylene, arylene, and heteroarylene;
$R^6$ is hydrogen or alkyl;
$R^{12}$ is the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; or both $R^{12}$ groups together may form an alkylene or alkenylene chain completing a 3, 4, 5, 6, or 7-membered aromatic or alicyclic ring, which ring may optionally include one or more divalent nitrogen, sulfur, selenium, tellurium, or oxygen atoms.

In one embodiment, the electrically conductive polymer is a copolymer of a precursor monomer and at least one second monomer. Any type of second monomer can be used, so long as it does not detrimentally affect the desired properties of the copolymer. In one embodiment, the second monomer comprises no more than 50% of the copolymer, based on the total number of monomer units. In one embodiment, the second monomer comprises no more than 30%, based on the total number of monomer units. In one embodiment, the second monomer comprises no more than 10%, based on the total number of monomer units.

Exemplary types of second monomers include, but are not limited to, alkenyl, alkynyl, arylene, and heteroarylene. Examples of second monomers include, but are not limited to, fluorene, oxadiazole, thiadiazole, benzothiadiazole, phenylenevinylene, phenyleneethynylene, pyridine, diazines, and triazines, all of which may be substituted.

In one embodiment, the copolymers are made by first forming an intermediate precursor monomer having the structure A-B-C, where A and C represent first precursor monomers, which can be the same or different, and B represents a second precursor monomer. The A-B-C intermediate precursor monomer can be prepared using standard synthetic organic techniques, such as Yamamoto, Stille, Grignard metathesis, Suzuki, and Negishi couplings. The copolymer is then formed by oxidative polymerization of the intermediate precursor monomer alone, or with one or more additional precursor monomers.

In one embodiment, the electrically conductive polymer is a copolymer of two or more precursor monomers. In one embodiment, the precursor monomers are selected from a thiophene, a selenophene, a tellurophene, a pyrrole, an aniline, and a polycyclic aromatic.

2. Partially-Fluorinated Acid Polymers

The partially-fluorinated acid polymer ("PFAP") can be any polymer which is partially fluorinated and has acidic groups with acidic protons. The acidic groups supply an ionizable proton. In one embodiment, the acidic proton has a pKa of less than 3. In one embodiment, the acidic proton has a pKa of less than 0. In one embodiment, the acidic proton has a pKa of less than −5. The acidic group can be attached directly to the polymer backbone, or it can be attached to side chains on the polymer backbone. Examples of acidic groups include, but are not limited to, carboxylic acid groups, sulfonic acid groups, sulfonimide groups, phosphoric acid groups, phosphonic acid groups, and combinations thereof. The acidic groups can all be the same, or the polymer may have more than one type of acidic group. In one embodiment, the acidic groups are selected from the group consisting of sulfonic acid groups, sulfonamide groups, and combinations thereof.

In one embodiment, the PFAP is water-soluble. In one embodiment, the PFAP is dispersible in water.

In one embodiment, the PFAP is organic solvent wettable. The term "organic solvent wettable" refers to a material which, when formed into a film, is wettable by organic solvents. In one embodiment, wettable materials form films which are wettable by phenylhexane with a contact angle no greater than 40°. As used herein, the term "contact angle" is intended to mean the angle φ shown in FIG. 1. For a droplet of liquid medium, angle φ is defined by the intersection of the plane of the surface and a line from the outer edge of the droplet to the surface. Furthermore, angle φ is measured after the droplet has reached an equilibrium position on the surface after being applied, i.e., "static contact angle". The film of the organic solvent wettable fluorinated polymeric acid is represented as the surface. In one embodiment, the contact angle is no greater than 35°. In one embodiment, the contact angle is no greater than 30°. The methods for measuring contact angles are well known.

In one embodiment, the polymer backbone is fluorinated. Examples of suitable polymeric backbones include, but are not limited to, polyolefins, polyacrylates, polymethacrylates, polyimides, polyamides, polyaramids, polyacrylamides, polystyrenes, and copolymers thereof. In one embodiment, the polymer backbone is highly fluorinated. In one embodiment, the polymer backbone is fully fluorinated.

In one embodiment, the acidic groups are sulfonic acid groups or sulfonimide groups. A sulfonimide group has the formula:

where R is an alkyl group.

In one embodiment, the acidic groups are on a fluorinated side chain. In one embodiment, the fluorinated side chains are selected from alkyl groups, alkoxy groups, amido groups, ether groups, and combinations thereof.

In one embodiment, the PFAP has a fluorinated olefin backbone, with pendant fluorinated ether sulfonate, fluorinated ester sulfonate, or fluorinated ether sulfonimide groups. In one embodiment, the polymer is a copolymer of 1,1-difluoroethylene and 2-(1,1-difluoro-2-(trifluoromethyl)allyloxy)-1,1,2,2-tetrafluoroethanesulfonic acid. In one embodiment, the polymer is a copolymer of ethylene and 2-(2-(1,2,2-trifluorovinyloxy)-1,1,2,3,3,3-hexafluoropropoxy)-1,1,2,2-tetrafluoroethanesulfonic acid. These copolymers can be made as the corresponding sulfonyl fluoride polymer and then can be converted to the sulfonic acid form.

In one embodiment, the PFAP is a homopolymer or copolymer of a fluorinated and partially sulfonated poly(arylene ether sulfone). The copolymer can be a block copolymer. Examples of comonomers include, but are not limited to butadiene, butylene, isobutylene, styrene, and combinations thereof.

In one embodiment, the PFAP is a homopolymer or copolymer of monomers having Formula VII:

(VII)

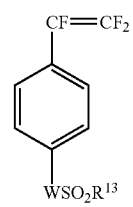

where:
b is an integer from 1 to 5,
$R^{13}$ is OH or $NHR^{14}$, and
$R^{14}$ is alkyl, fluoroalkyl, sulfonylalkyl, or sulfonylfluoroalkyl.

In one embodiment, the monomer is "SFS" or SFSI" shown below:

SFS

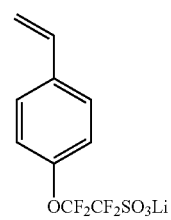

SFSI

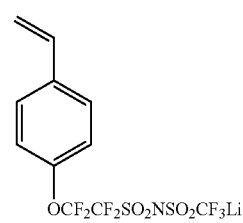

After polymerization, the polymer can be converted to the acid form.

In one embodiment, the PFAP is a homopolymer or copolymer of a trifluorostyrene having acidic groups. In one embodiment, the trifluorostyrene monomer has Formula VIII:

(VIII)

where:
W is selected from $(CF_2)_q$, $O(CF_2)_q$, $S(CF_2)_q$, $(CF_2)_qO(CF_2)_r$, and $SO_2(CF_2)_q$,
b is independently an integer from 1 to 5,
$R^{13}$ is OH or $NHR^{14}$, and
$R^{14}$ is alkyl, fluoroalkyl, sulfonylalkyl, or sulfonylfluoroalkyl.

In one embodiment, the monomer containing W equal to $S(CF_2)_q$ is polymerized then oxidized to give the polymer containing W equal to $SO_2(CF_2)_q$. In one embodiment, the polymer containing $R^{13}$ equal to F is converted its acid form where $R^{13}$ is equal to OH or $NHR^{14}$.

In one embodiment, the PFAP is a sulfonimide polymer having Formula IX:

(IX)

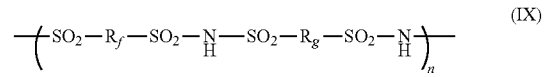

where:
R$_f$ is selected from fluorinated alkylene, fluorinated heteroalkylene, fluorinated arylene, or fluorinated heteroarylene;
R$_g$ is selected from fluorinated alkylene, fluorinated heteroalkylene, fluorinated arylene, fluorinated heteroarylene, arylene, or heteroarylene; and
n is at least 4.

In one embodiment of Formula IX, R$_f$ and R$_g$ are perfluoroalkylene groups. In one embodiment, R$_f$ and R$_g$ are perfluorobutylene groups. In one embodiment, R$_f$ and R$_g$ contain ether oxygens. In one embodiment, n is greater than 20.

In one embodiment, the PFAP comprises a fluorinated polymer backbone and a side chain having Formula X:

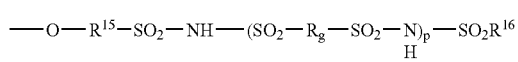

(X)

where:
R$_g$ is selected from fluorinated alkylene, fluorinated heteroalkylene, fluorinated arylene, fluorinated heteroarylene, arylene, or heteroarylene;
R$^{15}$ is a fluorinated alkylene group or a fluorinated heteroalkylene group;
R$^{16}$ is a fluorinated alkyl or a fluorinated aryl group; and
a is 0 or an integer from 1 to 4.

In one embodiment, the PFAP has Formula XI:

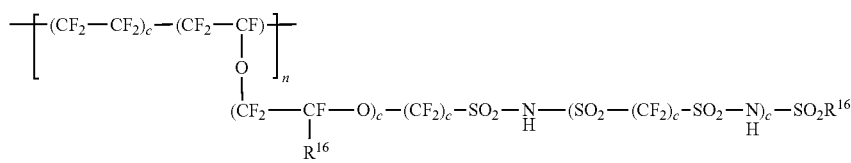

(XI)

where:
R$^{16}$ is a fluorinated alkyl or a fluorinated aryl group;
a, b, c, d, and e are each independently 0 or an integer from 1 to 4; and
n is at least 4.

The synthesis of PFAPs has been described in, for example, A. Feiring et al., J. Fluorine Chemistry 2000, 105, 129-135; A. Feiring et al., Macromolecules 2000, 33, 9262-9271; D. D. Desmarteau, J. Fluorine Chem. 1995, 72, 203-208; A. J. Appleby et al., J. Electrochem. Soc. 1993, 140(1), 109-111; and Desmarteau, U.S. Pat. No. 5,463,005.

In one embodiment, the PFAP comprises at least one repeat unit derived from an ethylenically unsaturated compound having Formula XII:

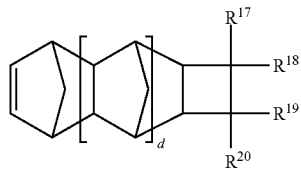

(XII)

wherein d is 0, 1, or 2;
R$^{17}$ to R$^{20}$ are independently H, halogen, alkyl or alkoxy of 1 to 10 carbon atoms, Y, C(R$_f'$)(R$_f'$)OR$^{21}$, R$^4$Y or OR$^4$Y;
Y is COE$^2$, SO$_2$E$^2$, or sulfonimide;
R$^{21}$ is hydrogen or an acid-labile protecting group;
R$_f'$ is the same or different at each occurrence and is a fluoroalkyl group of 1 to 10 carbon atoms, or taken together are (CF$_2$)$_e$ where e is 2 to 10;
R$^4$ is an alkylene group;
E$^2$ is OH, halogen, or OR$^5$; and
R$^5$ is an alkyl group;

with the proviso that at least one of R$^{17}$ to R$^{20}$ is Y, R$^4$Y or OR$^5$Y. R$^4$, R$^5$, and R$^{17}$ to R$^{20}$ may optionally be substituted by halogen or ether oxygen.

Some illustrative, but nonlimiting, examples of representative monomers of Formula XII and within the scope of the invention are presented in Formulas XIIa through XIIe (right to left) below:

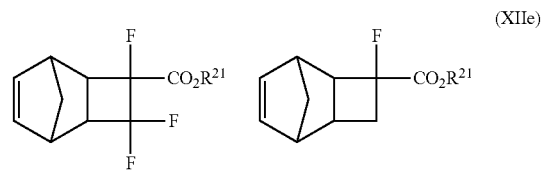

(XIIe)

-continued

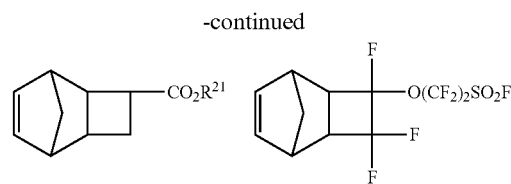

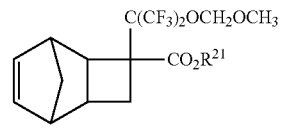

wherein R$^{21}$ is a group capable of forming or rearranging to a tertiary cation, more typically an alkyl group of 1 to 20 carbon atoms, and most typically t-butyl.

Compounds of Formula XII wherein d=0, such as Formula XII-a, may be prepared by cycloaddition reaction of unsaturated compounds of Formula XIII with quadricyclane (tetracyclo[2.2.1.0$^{2,6}$0$^{3,5}$]heptane) as shown in the equation below.

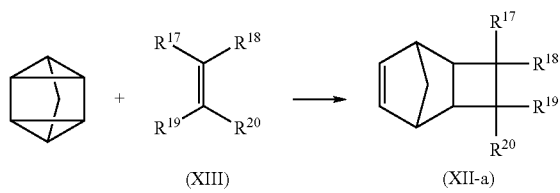

(XIII)  (XII-a)

The reaction may be conducted at temperatures ranging from about 0° C. to about 200° C., more typically from about 30° C. to about 150° C. in the absence or presence of an inert solvent such as diethyl ether. For reactions conducted at or above the boiling point of one or more of the reagents or solvent, a closed reactor is typically used to avoid loss of volatile components. Compounds of Formula XII with higher values of d (i.e., d=1 or 2) may be prepared by reaction of compounds of structure (XII) with d=0 with cyclopentadiene, as is known in the art.

In one embodiment, the PFAP also comprises a repeat unit derived from at least one ethylenically unsaturated compound containing at least one fluorine atom attached to an ethylenically unsaturated carbon. The fluoroolefin comprises 2 to 20 carbon atoms. Representative fluoroolefins include, but are not limited to, tetrafluoroethylene, hexafluoropropylene, chlorotrifluoroethylene, vinylidene fluoride, vinyl fluoride, perfluoro-(2,2-dimethyl-1,3-dioxole), perfluoro-(2-methylene-4-methyl-1,3-dioxolane), $CF_2=CFO(CF_2)_tCF=CF_2$, where t is 1 or 2, and $R_f''OCF=CF_2$ wherein $R_f''$ is a saturated fluoroalkyl group of from 1 to about ten carbon atoms. In one embodiment, the comonomer is tetrafluoroethylene.

In one embodiment, the PFAP comprises a polymeric backbone having pendant groups comprising siloxane sulfonic acid. In one embodiment, the siloxane pendant groups have the formula below:

—$O_aSi(OH)_{b-a}R^{22}{}_{3-b}R^{23}R_fSO_3H$ wherein:

a is from 1 to b;

b is from 1 to 3;

$R^{22}$ is a non-hydrolyzable group independently selected from the group consisting of alkyl, aryl, and arylalkyl;

$R^{23}$ is a bidentate alkylene radical, which may be substituted by one or more ether oxygen atoms, with the proviso that $R^{23}$ has at least two carbon atoms linearly disposed between Si and $R_f$; and $R_f$ is a perfluoralkylene radical, which may be substituted by one or more ether oxygen atoms.

In one embodiment, the PFAP having pendant siloxane groups has a fluorinated backbone. In one embodiment, the backbone is perfluorinated.

In one embodiment, the PFAP has a non-fluorinated or partially-fluorinated backbone and pendant groups represented by the Formula (XIV)

—$O_g$—[$CF(R_f{}^2)CF$—$O_h$]$_i$—$CF_2CF_2SO_3H$  (XIV)

wherein $R_f{}^2$ is F or a perfluoroalkyl radical having 1-10 carbon atoms either unsubstituted or substituted by one or more ether oxygen atoms, h=0 or 1, i=0 to 3, and g=0 or 1.

In one embodiment, the PFAP has formula (XV)

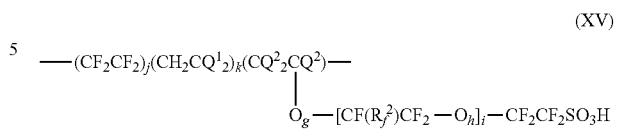

where j≧0, k≧0 and 4≦(j+k)≦199, $Q^1$ and $Q^2$ are F or H, $R_f{}^2$ is F or a perfluoroalkyl radical having 1-10 carbon atoms either unsubstituted or substituted by one or more ether oxygen atoms, h=0 or 1, i=0 to 3, g=0 or 1. In one embodiment $R_f{}^2$ is —$CF_3$, g=1, h=1, and i=1. In one embodiment the pendant group is present at a concentration of 3-10 mol-%.

In one embodiment, $Q^1$ is H, k≧0, and $Q^2$ is F, which may be synthesized according to the teachings of Connolly et al., U.S. Pat. No. 3,282,875. In another preferred embodiment, $Q^1$ is H, $Q^2$ is H, g=0, $R_f{}^2$ is F, h=1, and l=1, which may be synthesized according to the teachings of co-pending application Ser. No. 60/105,662. Still other embodiments may be synthesized according to the various teachings in Drysdale et al., WO 9831716(A1), and co-pending US applications Choi et al, WO 99/52954(A1), and 60/176,881.

In one embodiment, the PFAP is a colloid-forming polymeric acid. As used herein, the term "colloid-forming" refers to materials which are insoluble in water, and form colloids when dispersed into an aqueous medium. The colloid-forming polymeric acids typically have a molecular weight in the range of about 10,000 to about 4,000,000. In one embodiment, the polymeric acids have a molecular weight of about 100,000 to about 2,000,000. Colloid particle size typically ranges from 2 nanometers (nm) to about 140 nm. In one embodiment, the colloids have a particle size of 2 nm to about 30 nm. Any partially-fluorinated colloid-forming polymeric material having acidic protons can be used.

Some of the polymers described hereinabove may be formed in non-acid form, e.g., as salts, esters, or sulfonyl fluorides. They will be converted to the acid form for the preparation of conductive compositions, described below.

3. Cations

In one embodiment, the cations which replace the acidic protons are organic cations. Examples of organic cations include, but are not limited to, ammonium ions and ammonium ions substituted with one or more alkyl groups. In one embodiment, the alkyl groups have from 1-3 carbon atoms.

In one embodiment, some of the acidic protons are replaced with the positively-charged conductive polymer. In one embodiment, the conductive polymer is partially oxidized polyaniline in the emeraldine base form. In this form, the imine nitrogens are protonated.

In one embodiment, the cations which replace the acidic protons are inorganic cations. Examples of inorganic cations include, but are not limited to, cations from Groups 1 and 2 of the Periodic Table. In one embodiment, the inorganic cations are selected from the group consisting of Na+, K+, and combinations thereof.

The PFAP with acid protons replaced with cations, can be formed by reacting the PFAP with the cation base. For example, the acid form of the PFAP can be mixed with NaOH, to form the cation form of the PFAP. Alternatively, the PFAP can be treated with an ion exchange resin, as discussed below.

4. Preparation of Conductive Compositions

The new electrically conductive polymer composition is prepared by (i) polymerizing the precursor monomers in the presence of the PFAP; or (ii) first forming the intrinsically conductive copolymer and combining it with the PFAP.

(i) Polymerizing Precursor Monomers in the Presence of the PFAP

In one embodiment, the electrically conductive polymer composition is formed by the oxidative polymerization of the precursor monomers in the presence of the PFAP. In one embodiment, the precursor monomers comprise two or more conductive precursor monomers. In one embodiment, the monomers comprise an intermediate precursor monomer having the structure A-B-C, where A and C represent conductive precursor monomers, which can be the same or different, and B represents a non-conductive precursor monomer. In one embodiment, the intermediate precursor monomer is polymerized with one or more conductive precursor monomers.

In one embodiment, the oxidative polymerization is carried out in a homogeneous aqueous solution. In another embodiment, the oxidative polymerization is carried out in an emulsion of water and an organic solvent. In general, some water is present in order to obtain adequate solubility of the oxidizing agent and/or catalyst. Oxidizing agents such as ammonium persulfate, sodium persulfate, potassium persulfate, and the like, can be used. A catalyst, such as ferric chloride, or ferric sulfate may also be present. The resulting polymerized product will be a solution, dispersion, or emulsion of the conductive polymer in association with the PFAP. In one embodiment, the intrinsically conductive polymer is positively charged, and the charges are balanced by the PFAP anion.

In one embodiment, the method of making an aqueous dispersion of the new conductive polymer composition includes forming a reaction mixture by combining water, precursor monomer, at least one PFAP, and an oxidizing agent, in any order, provided that at least a portion of the PFAP is present when at least one of the precursor monomer and the oxidizing agent is added.

In one embodiment, the method of making the new conductive polymer composition comprises:
(a) providing an aqueous solution or dispersion of a PFAP;
(b) adding an oxidizer to the solutions or dispersion of step (a); and
(c) adding precursor monomer to the mixture of step (b).

In another embodiment, the precursor monomer is added to the aqueous solution or dispersion of the PFAP prior to adding the oxidizer. Step (b) above, which is adding oxidizing agent, is then carried out.

In another embodiment, a mixture of water and the precursor monomer is formed, in a concentration typically in the range of about 0.5% by weight to about 4.0% by weight total precursor monomer. This precursor monomer mixture is added to the aqueous solution or dispersion of the PFAP, and steps (b) above which is adding oxidizing agent is carried out.

In another embodiment, the aqueous polymerization mixture may include a polymerization catalyst, such as ferric sulfate, ferric chloride, and the like. The catalyst is added before the last step. In another embodiment, a catalyst is added together with an oxidizing agent.

In one embodiment, the polymerization is carried out in the presence of co-dispersing liquids which are miscible with water. Examples of suitable co-dispersing liquids include, but are not limited to ethers, alcohols, alcohol ethers, cyclic ethers, ketones, nitriles, sulfoxides, amides, and combinations thereof. In one embodiment, the co-dispersing liquid is an alcohol. In one embodiment, the co-dispersing liquid is an organic solvent selected from n-propanol, isopropanol, t-butanol, dimethylacetamide, dimethylformamide, N-methylpyrrolidone, and mixtures thereof. In general, the amount of co-dispersing liquid should be less than about 60% by volume. In one embodiment, the amount of co-dispersing liquid is less than about 30% by volume. In one embodiment, the amount of co-dispersing liquid is between 5 and 50% by volume. The use of a co-dispersing liquid in the polymerization significantly reduces particle size and improves filterability of the dispersions. In addition, buffer materials obtained by this process show an increased viscosity and films prepared from these dispersions are of high quality.

The co-dispersing liquid can be added to the reaction mixture at any point in the process.

In one embodiment, the polymerization is carried out in the presence of a co-acid which is a Brønsted acid. The acid can be an inorganic acid, such as HCl, sulfuric acid, and the like, or an organic acid, such as acetic acid or p-toluenesulfonic acid. Alternatively, the acid can be a water soluble polymeric acid such as poly(styrenesulfonic acid), poly(2-acrylamido-2-methyl-1-propanesulfonic acid, or the like, or a second PFAP, as described above. Combinations of acids can be used.

The co-acid can be added to the reaction mixture at any point in the process prior to the addition of either the oxidizer or the precursor monomer, whichever is added last. In one embodiment, the co-acid is added before both the precursor monomers and the PFAP, and the oxidizer is added last. In one embodiment the co-acid is added prior to the addition of the precursor monomers, followed by the addition of the PFAP, and the oxidizer is added last.

In one embodiment, the polymerization is carried out in the presence of both a co-dispersing liquid and a co-acid.

In one embodiment, a reaction vessel is charged first with a mixture of water, alcohol co-dispersing agent, and inorganic co-acid. To this is added, in order, the precursor monomers, an aqueous solution or dispersion of PFAP, and an oxidizer. The oxidizer is added slowly and dropwise to prevent the formation of localized areas of high ion concentration which can destabilize the mixture. The mixture is stirred and the reaction is then allowed to proceed at a controlled temperature. When polymerization is completed, the reaction mixture is treated with a strong acid cation resin, stirred and filtered; and then treated with a base anion exchange resin, stirred and filtered. Alternative orders of addition can be used, as discussed above.

In the method of making the new conductive polymer composition, the molar ratio of oxidizer to total precursor monomer is generally in the range of 0.1 to 2.0; and in one embodiment is 0.4 to 1.5. The molar ratio of PFAP to total precursor monomer is generally in the range of 0.2 to 5. In one embodiment, the ratio is in the range of 1 to 4. The overall solid content is generally in the range of about 1.0% to 10% in weight percentage; and in one embodiment of about 2% to 4.5%. The reaction temperature is generally in the range of about 4° C. to 50° C.; in one embodiment about 20° C. to 35° C. The molar ratio of optional co-acid to precursor monomer is about 0.05 to 4. The addition time of the oxidizer influences particle size and viscosity. Thus, the particle size can be reduced by slowing down the addition speed. In parallel, the viscosity is increased by slowing down the addition speed. The reaction time is generally in the range of about 1 to about 30 hours.

(ii) Combining Intrinsically Conductive Polymers with PFAPs

In one embodiment, the intrinsically conductive polymers are formed separately from the PFAP. In one embodiment, the polymers are prepared by oxidatively polymerizing the corresponding monomers in aqueous solution. In one embodiment, the oxidative polymerization is carried out in the presence of a water-soluble non-fluorinated polymeric acid. In one embodiment, the acid is a non-fluorinated polymeric sulfonic acid. Some non-limiting examples of the acids are poly(styrenesulfonic acid) ("PSSA"), poly(2-acrylamido-2-methyl-1-propanesulfonic acid) ("PAAMPSA"), and mixtures thereof. Where the oxidative polymerization results in a polymer that has positive charge, the acid anion provides the counterion for the conductive polymer. The oxidative polymerization is carried out using an oxidizing agent such as ammonium persulfate, sodium persulfate, and mixtures thereof.

The new electrically conductive polymer composition is prepared by blending the intrinsically conductive polymer with the PFAP. This can be accomplished by adding an aqueous dispersion of the intrinsically conductive polymer to a dispersion or solution of the PFAP. In one embodiment, the composition is further treated using sonication or microfluidization to ensure mixing of the components.

In one embodiment, one or both of the intrinsically conductive polymer and PFAP are isolated in solid form. The solid material can be redispersed in water or in an aqueous solution or dispersion of the other component. For example, intrinsically conductive polymer solids can be dispersed in an aqueous solution or dispersion of a PFAP.

(iii) Replacement of Acidic Protons with Cations

In one embodiment, conductive polymer composition is contacted with at least one ion exchange resin under conditions suitable to replace acidic protons with cations. The composition may be treated with one or more types of ion exchange resins, simultaneously or sequentially.

Ion exchange is a reversible chemical reaction wherein an ion in a fluid medium (such as an aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as cation exchangers or anion exchangers. Cation exchangers have positively charged mobile ions available for exchange, typically metal ions such as sodium ions. Anion exchangers have exchangeable ions which are negatively charged, typically hydroxide ions.

In one embodiment, a first ion exchange resin is a cation, acid exchange resin which can be in metal ion, typically sodium ion, form. A second ion exchange resin is a basic, anion exchange resin. Both acidic, cation proton exchange resins and basic, anion exchange resins can be used. In one embodiment, the acidic, cation exchange resin is an inorganic acid, cation exchange resin, such as a sulfonic acid cation exchange resin. Sulfonic acid cation exchange resins contemplated for use in the practice of the invention include, for example, sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin is an organic acid, cation exchange resin, such as carboxylic acid, acrylic or phosphorous cation exchange resin. In addition, mixtures of different cation exchange resins can be used.

In another embodiment, the basic, anionic exchange resin is a tertiary amine anion exchange resin. Tertiary amine anion exchange resins contemplated for use in the practice of the invention include, for example, tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin is a quaternary amine anion exchange resin, or mixtures of these and other exchange resins.

In one embodiment, both types of resins are added simultaneously to a liquid composition comprising the electrically conducting polymer and PFAP, and allowed to remain in contact with the liquid composition for at least about 1 hour, e.g., about 2 hours to about 20 hours. The ion exchange resins can then be removed from the dispersion by filtration. The size of the filter is chosen so that the relatively large ion exchange resin particles will be removed while the smaller dispersion particles will pass through. In general, about one to five grams of ion exchange resin is used per gram of new conductive polymer composition.

In some embodiments, the acidic protons are replaced by the addition of an aqueous basic solution. Examples of such as a solution include, but are not limited to, sodium hydroxide, ammonium hydroxide, tetra-methylammonium hydroxide, and the like.

In one embodiment, greater than 50% of the acidic protons are replaced with cations. In one embodiment, greater than 60% are replaced; in one embodiment, greater than 75% are replaced; in one embodiment, greater than 90% are replaced.

(iv) Hole Transport Layer

Any hole transport material may be used for the hole transport layer. In one embodiment the hole transport material has an optical band gap equal to or less than 4.2 eV and a HOMO level equal to or less than 6.2 eV with respect to vacuum level.

In one embodiment, the hole transport material comprises at least one polymer. Examples of hole transport polymers include those having hole transport groups. Such hole transport groups include, but are not limited to, carbazole, triarylamines, triarylmethane, fluorene, and combinations thereof.

In one embodiment, the hole transport layer comprises a non-polymeric hole transport material. Examples of hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino) phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino) benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino) styryl]-5-[p-(diethylamino)phenyl]pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine.

In one embodiment, the hole transport layer comprises a material having the Formula XVI:

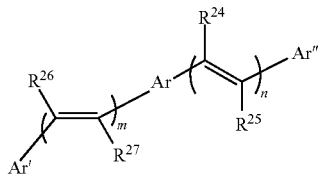

Formula XVI wherein
- Ar is an arylene group;
- Ar', and Ar" are selected independently from aryl groups;
- $R^{24}$ through $R^{27}$ are selected independently from the group consisting of hydrogen, alkyl, aryl, halogen, hydroxyl, aryloxy, alkoxy, alkenyl, alkynyl, amino, alkylthio, phosphino, silyl, —COR, —COOR, —PO$_3$R$_2$, —OPO$_3$R$_2$, and CN;
- R is selected from the group consisting of hydrogen, alkyl, aryl, alkenyl, alkynyl, and amino; and
- m and n are integers each independently having a value of from 0 to 5, where m+n≠0.

In one embodiment of Formula XVI, Ar is an arylene group containing two or more ortho-fused benzene rings in a straight linear arrangement.

(v) Methods of Making Bilayer Compositions

The hole injection and hole transport layers of the bilayer composition can be made using any technique for forming layers. In one embodiment, the hole injection layer is formed first, and the hole transport layer is formed directly on at least a part of the hole injection layer. In one embodiment, the hole transport layer is formed directly on and covering the entire hole injection layer.

In one embodiment, the hole injection layer is formed on a substrate by liquid deposition from a liquid composition. The term "substrate" is intended to mean a base material that can be either rigid or flexible and may be include one or more layers of one or more materials. Substrate materials can include, but are not limited to, glass, polymer, metal or ceramic materials or combinations thereof. The substrate may or may not include electronic components, circuits, conductive members, or layers of other materials.

Any known liquid deposition technique can be used, including continuous and discontinuous techniques. Continuous liquid deposition techniques, include but are not limited to, spin coating, gravure coating, curtain coating, dip coating, slot-die coating, spray coating, and continuous nozzle coating. Discontinuous liquid deposition techniques include, but are not limited to, ink jet printing, gravure printing, flexographic printing and screen printing.

In one embodiment, the hole injection layer is formed by liquid deposition from a liquid composition having a pH greater than 2. In one embodiment, the pH is greater than 4. In one embodiment, the pH is greater than 6.

In one embodiment, the hole transport layer is formed directly on at least a part of the hole injection layer by liquid deposition from a liquid composition.

In one embodiment, the hole transport layer is formed by vapor deposition onto at least a part of the hole injection layer. Any vapor deposition technique can be used, including sputtering, thermal evaporation, chemical vapor deposition and the like. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

The thickness of the hole injection layer can be as great as desired for the intended use. In one embodiment, the hole injection layer has a thickness in the range of 100 nm to 200 microns. In one embodiment, the hole injection layer has a thickness in the range of 50-500 nm. In one embodiment, the hole injection layer has a thickness less than 50 nm. In one embodiment, the hole injection layer has a thickness less than 10 nm. In one embodiment, the hole injection layer has a thickness that is greater than the thickness of the hole transport layer.

The thickness of the hole transport layer can be a little as a single monolayer. In one embodiment, the thickness is in the range of 100 nm to 200 microns. In one embodiment, the thickness is less than 100 nm. In one embodiment, the thickness is less than 10 nm. In one embodiment, the thickness is less than 1 nm.

5. Electronic Devices

In another embodiment of the invention, there are provided electronic devices comprising at least one layer made from the conductive polymer composition described herein. The term "electronic device" is intended to mean a device including one or more organic semiconductor layers or materials. An electronic device includes, but is not limited to: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, a phototube, an infrared ("IR") detector, or a biosensors), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

In one embodiment, the electronic device comprises at least one electroactive layer positioned between two electrical contact layers, wherein the device further includes the bilayer. The term "electroactive" when referring to a layer or material is intended to mean a layer or material that exhibits electronic or electro-radiative properties. An electroactive layer material may emit radiation or exhibit a change in concentration of electron-hole pairs when receiving radiation.

Figure 2:
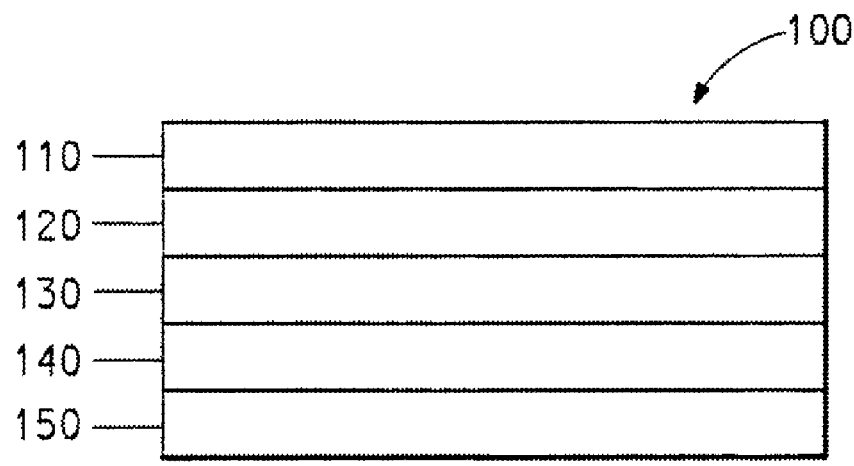
FIG. 2 includes an illustration of an electronic device having a high energy-potential bilayer composition.

As shown in FIG. 2, a typical device, 100, has an anode layer 110, a buffer layer 120, an electroactive layer 130, and a cathode layer 150. Adjacent to the cathode layer 150 is an optional electron-injection/transport layer 140.

The device may include a support or substrate (not shown) that can be adjacent to the anode layer 110 or the cathode layer 150. Most frequently, the support is adjacent the anode layer 110. The support can be flexible or rigid, organic or inorganic. Examples of support materials include, but are not limited to, glass, ceramic, metal, and plastic films.

The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), indium-zinc-oxide, aluminum-tin-oxide, gold, silver, copper, and nickel. The anode may also comprise an organic material, especially a conducting polymer such as polyaniline, including exemplary materials as described in "Flexible light-emitting diodes made from soluble conducting polymer," Nature vol. 357, pp 477 479 (11 Jun. 1992). At least one of the anode and cathode should be at least partially transparent to allow the generated light to be observed.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

In one embodiment, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used.

The conductive polymer compositions described herein are suitable as the buffer layer 120. The term "buffer layer" or "buffer material" is intended to mean electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. The buffer layer is usually deposited onto substrates using a variety of techniques well-known to those skilled in the art. Typical deposition techniques, as discussed above, include vapor deposition, liquid deposition (continuous and discontinuous techniques), and thermal transfer.

An optional layer, not shown, may be present between the buffer layer 120 and the electroactive layer 130. This layer may comprise hole transport materials. Examples of hole transport materials have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4',4''-tris(N,N-diphenyl-amino)-triphenylamine (TDATA); 4,4',4''-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis (naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate.

Depending upon the application of the device, the electroactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). In one embodiment, the electroactive material is an organic electroluminescent ("EL") material. Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, metal chelated oxinoid compounds, such as bis(2-methyl-8-quinolinato)(para-phenyl-phenolato)aluminum(III) (BAIQ) and tris(8-hydroxyquinolato)aluminum (Alq$_3$); tetrakis(8-hydroxyquinolinato)zirconium; azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthroline derivatives such as 9,10-diphenylphenanthroline (DPA) and 2,9-dimethyl-4,7-diphenyl-1,10-phenanthroline (DDPA); and any one or more combinations thereof. Alternatively, optional layer 140 may be inorganic and comprise BaO, LiF, Li$_2$O, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

The cathode layer 150 is usually formed by a chemical or physical vapor deposition process. In some embodiments, the cathode layer will be patterned, as discussed above in reference to the anode layer 110.

Other layers in the device can be made of any materials which are known to be useful in such layers upon consideration of the function to be served by such layers.

In some embodiments, an encapsulation layer (not shown) is deposited over the contact layer 150 to prevent entry of undesirable components, such as water and oxygen, into the device 100. Such components can have a deleterious effect on the organic layer 130. In one embodiment, the encapsulation layer is a barrier layer or film. In one embodiment, the encapsulation layer is a glass lid.

Though not depicted, it is understood that the device 100 may comprise additional layers. Other layers that are known in the art or otherwise may be used. In addition, any of the above-described layers may comprise two or more sub-layers or may form a laminar structure. Alternatively, some or all of anode layer 110 the buffer layer 120, the electron transport layer 140, cathode layer 150, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In one embodiment, the different layers have the following range of thicknesses: anode 110, 500-5000 Å, in one embodiment 1000-2000 Å; buffer layer 120, 50-2000 Å, in one embodiment 200-1000 Å; photoactive layer 130, 10-2000 Å, in one embodiment 100-1000 Å; optional electron transport layer 140, 50-2000 Å, in one embodiment 100-1000 Å; cathode 150, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In operation, a voltage from an appropriate power supply (not depicted) is applied to the device 100. Current therefore passes across the layers of the device 100. Electrons enter the organic polymer layer, releasing photons. In some OLEDs, called active matrix OLED displays, individual deposits of photoactive organic films may be independently excited by the passage of current, leading to individual pixels of light emission. In some OLEDs, called passive matrix OLED displays, deposits of photoactive organic films may be excited by rows and columns of electrical contact layers.

EXAMPLES

The concepts described herein will be further described in the following examples, which do not limit the scope of the invention described in the claims.

Example 1

This example illustrates the preparation of a PFAP for determination of thermal stability and for preparation of a thermally stable, conductive polymer composition.

The polymer is a copolymer of 1,1-difluoroethylene ("VF$_2$") and 2-(1,1-difluoro-2-(trifluoromethyl)allyloxy)-1,1,2,2-tetrafluoroethanesulfonyl fluoride ("PSEBVE"), which has been converted to the sulfonic acid form. The resulting polymer is referred to as Poly(VF$_2$-PSEBVE acid).

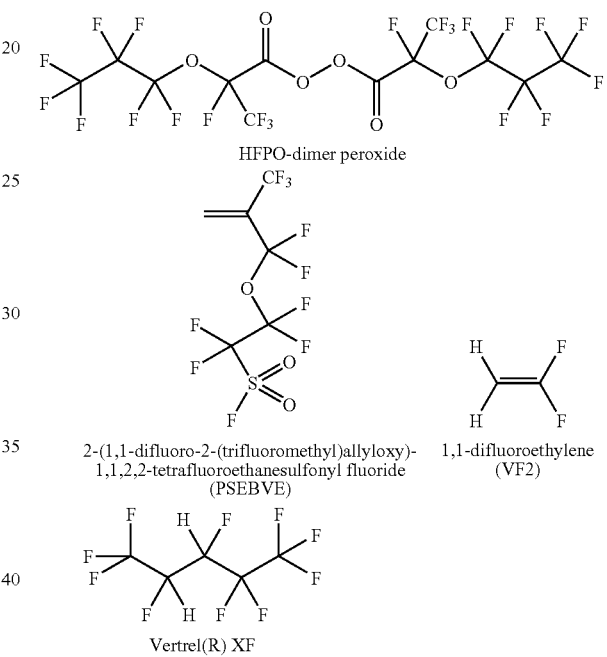

A 400 mL Hastelloy 0276 reaction vessel was charged with 160 mL of Vertrel® XF, 4 mL of a 20 wt. % solution of HFPO dimer peroxide in Vertrel® XF, and 143 g of PSEBVE (0.42 mol). The vessel was cooled to −35° C., evacuated to −3 PSIG, and purged with nitrogen. The evacuate/purge cycle was repeated two more times. To the vessel was then added 29 g VF$_2$ (0.45 mol). The vessel was heated to 28° C., which increased the pressure to 92 PSIG. The reaction temperature was maintained at 28° C. for 18 h. at which time the pressure had dropped to 32 PSIG. The vessel was vented and the crude liquid material was recovered. The Vertrel® XF was removed in vacuo to afford 110 g of desired copolymer.

Conversion of the sulfonyl fluoride copolymer prepared above to sulfonic acid was carried out in the following manner. 20 g of dried polymer and 5.0 g lithium carbonate were refluxed in 100 mL dry methanol for 12 h. The mixture was brought to room temperature and filtered to remove any remaining solids. The methanol was removed in vacuo to isolate the lithium salt of the polymer. The lithium salt of the polymer was then dissolved in water and added with Amberlyst 15, a protonic acid exchange resin which had been washed thoroughly with water until there was no color in the water. The mixture was stirred and filtered. Filtrate was added with fresh Amberlyst 15 resin and filtered again. The step was repeated two more times. Water was then removed from the final filtrates and the solids were then dried in a vacuum oven at about 60° C.

Comparative Example A

This comparative example illustrates the insufficient thermal stability of Poly(VF2-PSEBVE acid) made in Example 1.

The poly(VF2-PSEBVE acid) solid made in Example 1 was determined for thermal stability by thermal gravimetric analysis (TGA). It shows that the solid lost about 39% weight from 25° C. to 250° C., which reveals that the acid polymer is not thermally stable.

A small amount of poly(VF2-PSEBVE acid) solid was dissolved in water to form a 2.4% solution. pH was measured to be 1.6. Ion chromatography analysis shows that the solution contains $0.7 \times 10^{-6}$ g fluoride and $98 \times 10^{-6}$ g sulfate per one mL solution. The ion concentration is approximately equivalent to $<1 \times 10^{-6}$ mole fluoride, and $1 \times 10^{-6}$ mole sulfate per one gram of the solution. Based on the solid % of the solution and composition of poly[VF2(1 mole)-PSEBVE (1 mole) acid], the solution contains about $59 \times 10^{-6}$ sulfonic acid group per one gram of the solution. The ion analysis data clearly shows that poly(VF2-PSEBVE acid) is in almost 100% protonic form. The protonic acid polymer where excessive proton is the source of poor thermal stability of the non-perfluorosulfonic acid polymer, which becomes evident when compared with a perfluoro-polymeric sulfonic acid shown in Comparative Example 2.

Comparative Example B

This example illustrates the high thermal stability of Nafion®, a Poly(perfluoroethyleneethersulfonic acid) supplied by E.I. du Pont de Nemours and Company, Wilmington, Del.

A 25% (w/w) aqueous colloidal dispersion of Nafion® having an EW of 1050 was made using a procedure similar to the procedure in U.S. Pat. No. 6,150,426, Example 1, Part 2, except that the temperature was approximately 270° C. The dispersion was dried into solids by flowing nitrogen at room temperature. It was determined for thermal stability by TGA. It lost about 4% weight from 25° C. to 300° C. in nitrogen. The loss is primarily due to absorbed moisture because of hygroscopic nature of the acid polymer. The TGA shows that Nafion® in 100% protonic acid form is very stable. This is in marked contrast from poly(VF2-PSEBVE acid) solid, as illustrated in Comparative Example 1, which is not a perfluoropolymeric sulfonic acid.

Example 2

This example illustrates high temperature composition and stability of high pH poly(VF2-PSEBVE acid).

Part of the dried solid made in comparative example 1 was dissolved in water and added with NaOH/H2O solution to increase pH to 2.9. The pH2.9 solution contains 2.4% (w/w) partially neutralized poly(VF2-PSEBVE acid). Ion chromatography analysis shows that the solution contains $0.8 \times 10^{-6}$ g fluoride, $113 \times 10^{-6}$ g sulfate, and $1,320 \times 10^{-6}$ g Na+ per one-mL solution. The ion concentration is approximately equivalent to $<1 \times 10^{-6}$ mole fluoride, $1.2 \times 10^{-6}$ mole sulfate, and $57 \times 10^{-6}$ g mole Na+ per one gram of the solution. Based on the solid % of the solution and composition of poly(VF2-PSEBVE acid), the solution contains about $59 \times 10^{-6}$ sulfonic acid group per one gram of the solution. The ion data clearly reveals that only 7% of the sulfonic acid in poly(VF2-PSEBVE acid) remain as free acid.

Dried solid of the pH2.9 poly(VF2-PSEBVE acid) was determined for thermal stability by thermal gravimetric analysis (TGA). It lost only 3.2% weight from 25° C. to 400° C. in nitrogen, The weight loss occurred at low temperature and was primarily due to absorbed moisture. The TGA result clearly shows that sodium cations replacing some of the protons in non-perfluoropolymeric acids enhances thermal stability of the polymer. In this example, 93% of the protons were replaced with Na+.

Example 3

This example illustrates the preparation of thermally stable, and electrically conductive polyaniline made in the presence of Poly(VF2-PSEBVE acid).

78.61 g of deionized water and 45.38 g of 99.7% n-propanol were massed directly into a 1,000 mL reactor vessel at room temperature. Next, 0.0952 mL (1.2 mmol) of 37% wt. HCl and 0.6333 mL (7.0 mmol) of aniline (distilled) were added to the reactor via pipet. The mixture was stirred overhead with a U-shaped stir-rod set at 100 RPM. After five minutes, 53.60 g of 4.39% water solution of the polymer (5.80 mmol) made in Example 1 (10.90 mmol) was added slowly via a glass funnel. The mixture was allowed to homogenize at 200 rpm for an additional 10 minutes. 1.65 g (7.2 mmol) of ammonium persulfate (99.99+%) dissolved in 20 g of DI water was added drop wise to the reactants via syringe infusion pump in six hours. Eight minutes later the solution turned light turquoise. The solution progressed to being dark blue before turning very dark green. After the APS addition, the mixture was stirred for 60 minutes and 4.68 g of Amberlyst®15 (Rohm and Haas Co., Philadelphia, Pa.) cation exchange resin (rinsed multiple times with a 32% n-propanol/DI water mixture and dried under nitrogen) was added and the stirring commenced overnight at 200 RPM. The next morning, the mixture was filtered through steel mesh. The pH of the Amberlyst® 15 treated dipsersion was 1.2. A portion of the dispersion was stirred with Amberjet® 4400 (OH) (Rohm and Haas Co., Philadelphia, Pa.) anion exchange resin (rinsed multiple times with a 32% n-propanol/DI water mixture and dried under nitrogen) until the pH had changed from 1.2 to 5.7. The resin was again filtered off and the filtrate is a stable dispersion. Solid % of the dispersion was determined to be 1.85% (w/w).

Ion chromatography analysis shows that the dispersion contains $82.8 \times 10^{-6}$ g Na+, $315.8 \times 10^{-6}$ g $NH_4^+$, and $128 \times 10^{-6}$ g sulfate per one mL of the dispersion. The ion concentration is approximately equivalent to $17.5 \times 10^{-6}$ mole (mmole) $NH_4^+$, 3.6 mmole Na+, 1.3 mmole sulfate per one gram of the dispersion, respectively. Charge balance leaves 18.5 mmoles $NH_4^+$ and Na+ available for association with sulfonic acid of poly(VF2-PSEBVE acid). Based on the solid %, and mole ratio of poly(VF2-PSEBVE acid) with respect to aniline used in the polymerization, the dispersion contains about 36 mmole sulfonic acid group per one gram of the dispersion. UV/V is of the dispersion and solid film reveals that the oxidation state of the polyaniline is derived from emeraldine base structure, therefore every two aniline should have one sulfonic acid to form polyaniline emeraldine salt. Based on the mole ratio of poly(VF2-PSEBVE acid)/aniline and solid %, the dispersion contains about 42 mmole aniline per one gram dispersion. The amount aniline reveals that 21 mmole sulfonic acid per one-gram dispersion forms emeraline ammonium salt. Remaining free sulfonic acid in the poly (VF2-PSEBVE acid) is about 15 mmole per one gram of the dispersion. The free acids were less than the combined NH+ and Na+. This shows that there is no free acid left.

TGA shows that dried solid of Polyaniline/poly(VF2-PSE-BVE acid) only lost 7.5% from 25° C. to 400° C. in nitrogen. The weight loss occurred at low temperature and was primarily due to absorbed moisture. This example clearly demonstrates that poly(VF2-PSEVE acid) forms thermally stable, electrically conducting polymer. Electrical conductivity of the conducting polymer is shown in Example 4.

Example 4

The examples illustrates the properties and device performance of Polyaniline/Poly(VF2-PSEBVE acid).

The dispersion made in Example 3 was filtered through a 0.45 μm Millipore Millex®-HV syringe filter with PVDF membrane (Millex® is a registered mark of Millipore Investment Holdings Ltd., Wilmington, Del.). The dispersions were spun onto glass at 1,000 RPM for 80 seconds, resulting in films having a thickness of 831 Å once baked at 130° C. for 5 minutes in air and further baked at 200° C. for 10 minutes in glove box. Conductivity was measured to be $4.0 \times 10^{-4}$ S/cm.

The polyaniline/poly(VF2-PSEBVE acid) was then tested for device performance. The dispersion was spun on a 6"×6" glass plate. The plate had an ITO thickness of 100 to 150 nm and consisted of 16 backlight substrates. Each substrate consisted of 3 pieces of 5 mm×5 mm pixel and 1 piece of 2 mm×2 mm pixel for light emission. The spin-coated films as buffer layer layers were then baked at 130° C. for 5 minutes on a hot plate in air. The thickness of the baked buffer layers was about 80 nm. For light-emitting layer, a 1% (w/v) toluene solution of a green polyfluorene-based light-emitting polymer was spin-coated on top of the buffer layer films and subsequently baked at 130° C. for 10 minutes on a hot plate in an inert atmosphere dry box. The thickness of the baked films was 75 nm. Immediately after, a 3 nm thick barium layer and a 350-400 nm aluminum layer were deposited on the green light-emitting polymer films to serve as a cathode. The devices have efficiency of 10.5 cd/A at 1,000 nits (cd/m$^2$), voltage of 3.3 volt at 1,000 nits, and half-life of 500-600 hrs at 5,000 nits.

Example 5

This example illustrates the preparation of thermally stable, electrically conductive Poly(3,4-ethylenedioxythiophene) made in the presence of Poly(VF2-PSEBVE acid).

42.59 g of aqueous solution of 2.89% Poly(VF$_2$—PSE-BVE acid) made in Example 1 and 65.18 g deionized water were poured into a 250 mL Erlenmeyer flask. The mixture was stirred with a magnetic stirrer for 10 minutes. 0.101 mL (0.948 mmoles) of Baytron®-M (a trade name for 3,4-ethylenedioxythiophene from H. C. Starck, Massachusetts, USA) was added to the reaction solution with stirring. The mixture was stirred for 30 minutes. 2.99 g of the ferric sulfate stock solution made in Example 3 was then added to the reaction mixture and stirred for 2 minutes. A sodium persulfate solution made with 0.28 g (2.04 mmoles) sodium persulfate (Fluka®, obtained from Sigma-Aldrich Corp., St. Louis, Mo., USA) and 9.11 g deionized water was dripped into the reaction mixture with a syringe pump in about 30 minutes. Polymerization was allowed to proceed with stirring at about 23° C. for 23 and half an hour.

The reaction mixture was mixed with 2.63 g of Lewatit® S100 and 2.59 g of Lewatit® MP62® WS in the Erlenmeyer flask and stirred for 5 hours. The resulting slurry was then suction pre-filtered through a coarse fritted-glass funnel and then through a Buchner Funnel containing two pieces of Whatman #4 Filter Paper. Not only was filtration easy, but also when finished there was no sedimentation on the Filter Paper. Yield is 105.61 g. Solid % (w/w) of the dispersion was 0.95%. The pH of the dark filtrate was measured to be 4.3. Its dried (baked at 80° C. for 10 minutes in vacuo) film conductivity was $5.8 \times 10^{-4}$ S/cm.

The PEDOT/Poly(VF2-PSEBVE acid) dispersion made contains 0.95% solid and has pH of 4.3. Ion chromatography analysis shows that the dispersion contains $441 \times 10^{-6}$ g Na$^+$, $4.2 \times 10^{-6}$ g NH$_4^+$, $214 \times 10^{-6}$ g per one mL dispersion. The ion concentration is approximately equivalent to $19 \times 10^{-6}$ mole Na$^+$, $0.2 \times 10^{-6}$ mole NH$_4^+$, $2.2 \times 10^{-6}$ mole sulfate per one gram of the dispersion. Charge balance leaves 15 mmoles NH$_4^+$ and Na+ available for association with sulfonic acid of poly(VF2-PSEBVE acid). Based on the solid %, and amount of poly(VF2-PSEBVE acid) used in the polymerization, the dispersion contains about $20.3 \times 10^{-6}$ sulfonic acid group per one gram of the dispersion. This reveals that about 70% of the sulfonic acid group forms sodium and ammonium salt in the solid. Some of the remaining sulfonic acid anions form complexes with partially oxidized 3,4-ethylenedioxythiophene (EDOT) to balance the positive charges. It is reasonably estimated that about 3.5 EDOT unit is one electron deficient. Total number of EDOT used in the polymerization is $1.8 \times 10^{-6}$ mole per gram of the dispersion. It is therefore estimated that $1.8 \times 10^{-6}$ sulfonic acid is used as anions to balance the partially oxidized poly(EDOT). This leads to about 17% of the sulfonic acid still remains as free acid in the solid.

TGA shows that dried solid of PEDOT/poly(VF2-PSE-BVE acid) only lost about 8% from 25° C. to 400° C. in nitrogen. The weight loss occurred mostly at low temperature and was primarily due to absorbed moisture. This example clearly demonstrates that poly(VF2-PSEVE acid) forms thermally stable, electrically conducting polymer.

Example 6

This example illustrates the use of the thermally stable, electrically conductive polymer as a buffer layer in an electronic device. The conductive polymer composition is poly (3,4-ethylenedioxythiophene)/poly(VF2-PSEBVE acid) from Example 5.

The 0.95% (w/w) aqueous dispersion made in Example 5 was tested for device performance. The dispersion was spun on a 30 mm×30 mm ITO/glass substrate. The substrate had an ITO thickness of 100 to 150 nm and consisted of 3 pieces of 5 mm×5 mm pixel and 1 piece of 2 mm×2 mm pixel for light emission. The spin-coated films as buffer layer layers were then baked at 90° C. in air for 30 minutes. The thickness of the baked buffer layers was 750 nm. For the light-emitting layer, a 1% (w/v) p-xylene solution of a green polyfluorene-based light-emitting polymer was spin-coated on top of the buffer layer films and subsequently baked at 90° C. in vacuum for 30 minutes. The final thickness was ~750 Å. Immediately after, a 4 nm thick barium layer and a 200 nm aluminum layer were deposited on the light-emitting polymer films to serve as a cathode. The devices dropped from 2,000 nits to 1000 nits (half-life) in 1200 hrs, which is a long stress-life at that luminance level.

Example 7

This example illustrates the preparation of a non-perfluorosulfonic acid polymer for determination of thermal stability and for preparation of a thermally stable, conductive polymer composition. The polymer is a copolymer of ethylene ("E") and 2-(2-(1,2,2-trifluorovinyloxy)-1,1,2,3,3,3-hexafluoropropoxy)-1,1,2,2-tetrafluoroethanesulfonyl fluoride ("PSEPVE"), which has been converted to the sulfonic acid form. The resulting polymer is referred to as Poly(E-PSEPVE acid).

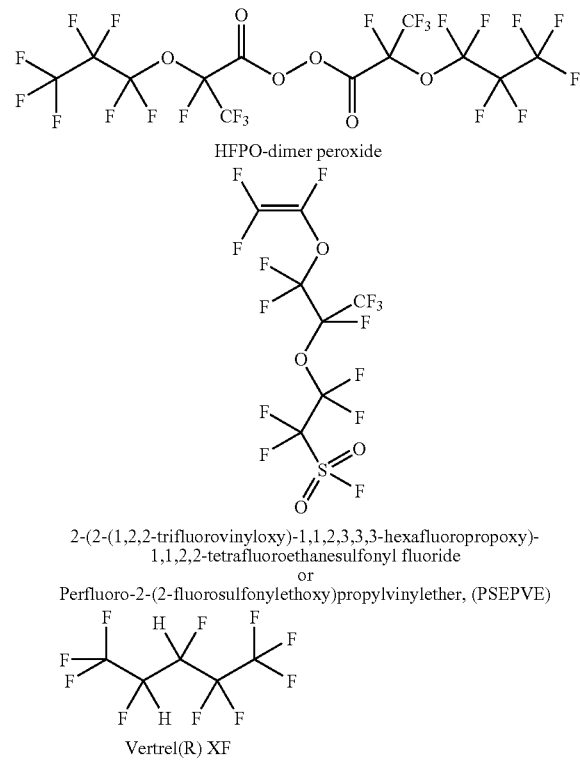

A 210 mL Hastelloy C276 reaction vessel was charged with 60 g of PSEPVE (0.13 mol) and 1 mL of a 0.17 M solution of HFPO dimer peroxide in Vertrel® XF. The vessel was cooled to −35° C., evacuated to −3 PSIG, and purged with nitrogen. The evacuate/purge cycle was repeated two more times. To the vessel was then added 20 g ethylene (0.71 mol) and an additional 900 PSIG of nitrogen gas. The vessel was heated to 24° C., which increased the pressure to 1400 PSIG. The reaction temperature was maintained at 24° C. for 18 h. at which time the pressure had dropped to 1350 PSIG. The vessel was vented and 61.4 g of crude material was recovered. 10 g of this material were dried at 85° C. and 20 milliTorr for 10 h. to give 8.7 g of dried polymer.

Conversion of the sulfonyl fluoride copolymer prepared above to sulfonic acid was carried out in the following manner. A mixture of 19.6 g of dried polymer and 5.6 g lithium carbonate were refluxed in 300 mL dry methanol for 6 h. The mixture was brought to room temperature and filtered to remove any remaining solids. The methanol was removed in vacuo to afford 15.7 g of the lithium salt of the polymer. The lithium salt of the polymer was then dissolved in water and added with Amberlyst® 15, a protonic acid exchange resin which had been washed thoroughly with water until there was no color in the water. The mixture was stirred and filtered. Filtrate was added with fresh Amberlyst® 15 resin and filtered again. The step was repeated two more times. Water was then removed from the final filtrates and the solids were then dried in a vacuum oven at ~60° C.

Comparative Example C

This comparative example illustrates insufficient thermal stability of Poly(E-PSEPVE acid) made in Example 7:

The poly(E-PSEPVE acid) solid made in Example 7 was determined for thermal stability by thermal gravimetric analysis (TGA). It shows that the solid lost about 45% weight from 25° C. to 250° C., which reveals that the polymer is not thermally stable.

A small amount of poly(E-PSEPVE acid) solid was dissolved in water to form a 1.82% solution. pH was measured to be 1.9. Ion chromatography analysis shows that the solution contains $21 \times 10^{-6}$ g Li+, $8 \times 10^{-6}$ g Na+, and $13.4 \times 10^{-6}$ g sulfate per one mL of the solution. The ion concentration is approximately equivalent to $3 \times 10^{-6}$ mole Li+, $0.3 \times 1 \times 10^{-6}$ mole Na+, and $0.1 \times 10^{-6}$ mole per one gram of the solution. Based on the solid % of the solution and composition of poly[E (1 mole)-PSEPVE (1 mole) acid], the solution contains about $38.5 \times 10^{-6}$ mole sulfonic acid group per one gram of the solution. The ion analysis data clearly shows that poly(E-PSEPVE acid) is in almost 91% protonic form. The protonic acid polymer where excessive proton is the source of poor thermal stability of the non-perfluorosulfonic acid polymer, which becomes evident when compared with a perfluoro-polymeric sulfonic acid shown in Comparative Example 2.

Example 8

This example illustrates high temperature composition of pH 3.0 poly(E-PSEPVE acid).

A small amount of the dried solid made in Example 7 was dissolved in water and added with NaOH/H2O solution to increase pH to 3.0. The pH 3.0 solution contains 1.6% (w/w) partially neutralized poly(E-PSEPVE acid). Ion chromatography analysis shows that the solution contains $515 \times 10^{-6}$ g Na+, $17.2 \times 10^{-6}$ g Li+, and $15 \times 10^{-6}$ g sulfate per one mL solution. The ion concentration is approximately equivalent to $22.4 \times 10^{-6}$ mole Na+ $2.5 \times 10^{-6}$ mole Li, and $0.2 \times 10^{-6}$ mole sulfate per one gram of the solution. Based on the solid % of the solution and composition of poly(E-PSEPVE acid), the solution contains about $34 \times 10^{-6}$ sulfonic acid group per one gram of the solution. The ion data clearly reveals that only 28% of the sulfonic acid in poly(E-PSEPVE acid) remain as free acid.

Dried solid of the pH 3.0 poly(E-PSEPVE acid) was determined for thermal stability by thermal gravimetric analysis (TGA). It lost only 9% weight from 25° C. to 300° C. in nitrogen, The weight loss occurred at low temperature and was primarily due to absorbed moisture. The TGA result clearly shows that sodium cations replacing some of the protons in non-perfluoropolymeric acids enhances thermal stability of the polymer. In this example, 72% of the protons were replaced with Na+.

Example 9

This example illustrates high temperature composition of pH 4.2 poly(E-PSEPVE acid).

A small amount of the dried solid made in Example 7 was dissolved in water and added with NaOH/H2O solution to increase pH to 4.2. The pH 4.2 solution contains 1.8% (w/w) partially neutralized poly(E-PSEPVE acid). Ion chromatography analysis shows that the solution contains $663 \times 10^{-6}$ g Na+, $19 \times 10^{-6}$ g Li+, and $15 \times 10^{-6}$ g sulfate per one-mL solution. The ion concentration is approximately equivalent to $29 \times 10^{-6}$ mole Na+ $2.8 \times 10^{-6}$ mole Li, and $0.2 \times 10^{-6}$ mole sulfate per one gram of the solution. Based on the solid % of the solution and composition of poly(E-PSEPVE acid), the solution contains about $38 \times 10^{-6}$ sulfonic acid group per one gram of the solution. The ion data clearly reveals that only 17% of the sulfonic acid in poly(E-PSEPVE acid) remains as free acid.

Dried solid of the pH 4.2 poly(E-PSEPVE acid) was determined for thermal stability by thermal gravimetric analysis (TGA). It lost only 2% weight from 25° C. to 300° C. in nitrogen. The weight loss occurred at low temperature and was primarily due to absorbed moisture. The TGA result clearly shows that sodium cations replacing some of the protons in non-perfluoropolymeric acids enhances thermal stability of the polymer. In this example, 83% of the protons were replaced with Na+.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

In some embodiments, the invention herein can be construed as excluding any element or process step that does not materially affect the basic and novel characteristics of the composition or process. Additionally, in some embodiments, the invention can be construed as excluding any element or process step not specified herein.

The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination.

What is claimed is:

1. An electrically conductive polymer composition consisting of an electrically conductive polymer formed from at least one precursor monomer selected from the group consisting of thiophenes, selenophenes, and tellurophenes, and a partially-fluorinated water-soluble acid polymer, wherein at least 50% of acid protons on the partially-fluorinated acid polymer are replaced with cations selected from the group consisting of inorganic cations, organic cations, and combinations thereof.

2. The conductive composition of claim 1 wherein the thiophene, selenophene and tellurophene precursor monomers comprise Formula I or Formula I(a) below:

wherein:
Q is selected from the group consisting of S, Se, and Te;
$R^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, selenium, tellurium, or oxygen atoms; and

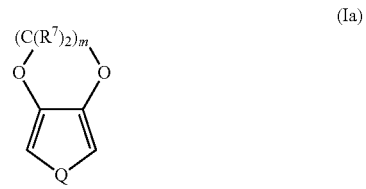

wherein:
Q is selected from the group consisting of S, Se, and Te;
$R^7$ is the same or different at each occurrence and is selected from hydrogen, alkyl, heteroalkyl, alkenyl, heteroalkenyl, alcohol, amidosulfonate, benzyl, carboxylate, ether, ether carboxylate, ether sulfonate, ester sulfonate, and urethane, with the proviso that at least one $R^7$ is not hydrogen, and
m is 2 or 3.

3. The conductive composition of claim 2 wherein, in the precursor monomer of Formula I, both $R^1$ together form —O—$(CHY)_m$—O—, where m is 2 or 3, and Y is the same or different at each occurrence and is selected from hydrogen, halogen, alkyl, alcohol, amidosulfonate, benzyl, carboxylate, ether, ether carboxylate, ether sulfonate, ester sulfonate, and urethane, where the Y groups may be partially or fully fluorinated.

4. The conductive composition of claim 2 wherein, in the precursor monomer of Formula I(a), m is two, one $R^7$ is an alkyl group of more than 5 carbon atoms, and all other $R^7$ are hydrogen, and the alkyl group may be partially or fully fluorinated.

5. The conductive composition of claim 1 wherein the partially-fluorinated acid polymer comprises Formula XV:

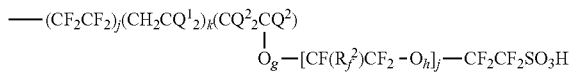
(XV)

where $j \geq 0$, $k \geq 0$ and $4 \leq (j+k) \leq 199$, $Q^1$ and $Q^2$ are F or H, $R_f^2$ is F or a perfluoroalkyl radical having 1-10 carbon atoms either unsubstituted or substituted by one or more ether oxygen atoms, h=0 or 1, i=0 to 3, and g=0 or 1.

6. The conductive composition of claim 1 wherein the partially-fluorinated acid polymer is dispersible in water.

7. The conductive composition of claim 1 wherein the partially-fluorinated acid polymer is colloid-forming.

8. The conductive composition of claim 1, wherein the conducting polymer is doped with the partially-fluorinated acid polymer.

9. The conductive composition of claim 1, wherein the cations are selected from the group consisting of ammonium ions, alkylammonium ions, sodium ions, potassium ions, partially oxidized polyaniline, and combinations thereof.

10. A buffer composition comprising a conductive composition of claim 1.

11. A buffer layer comprising a conductive composition of claim 1.

* * * * *